United States Patent [19]

Takeda et al.

[11] Patent Number: 4,551,639
[45] Date of Patent: Nov. 5, 1985

[54] EMITTER COUPLED LOGIC CIRCUIT CONTROLLED BY A SET INPUT SIGNAL

[75] Inventors: Hirofumi Takeda, Yokohama; Hirokazu Suzuki, Yamato, both of Japan

[73] Assignee: Fujitsu Limited, Kawasaki, Japan

[21] Appl. No.: 502,560

[22] Filed: Jun. 9, 1983

[30] Foreign Application Priority Data

Jun. 29, 1982 [JP] Japan ................. 57-110619

[51] Int. Cl.[4] ............... H03K 19/086; H03K 19/092; H03K 3/023; H03K 19/003
[52] U.S. Cl. .................................. 307/455; 307/443; 307/355; 307/475; 307/608; 307/272 R
[58] Field of Search ............... 307/443, 455, 467, 457, 307/200 A, 299 A, 475, 289, 272 R, 272 A, 273, 494, 605, 608, 355, 362; 330/252, 261

[56] References Cited

U.S. PATENT DOCUMENTS

| | | | |
|---|---|---|---|
| 3,321,639 | 5/1967 | Fowler et al. | 307/455 |
| 3,612,911 | 10/1971 | Kroos | 307/289 |
| 3,906,212 | 9/1975 | Poguntke | 307/455 X |
| 4,347,446 | 8/1982 | Price | 307/443 |

Primary Examiner—Stanley D. Miller
Assistant Examiner—David R. Bertelson
Attorney, Agent, or Firm—Staas & Halsey

[57] ABSTRACT

An emitter coupled logic circuit includes a differential transistor pair and a set transistor, which are all emitter coupled. The logic level of the high voltage side of a set input signal to be applied, as a control input signal, to the set transistor is higher than the logic level of the high voltage side of the logic input signal pair to be applied, as control input signals, to the differential transistor pair. Simultaneously, the logic level of the low voltage side of the set input signal is lower than the logic level of the low voltage side of the logic input signal pair.

13 Claims, 6 Drawing Figures

EMITTER COUPLED LOGIC CIRCUIT CONTROLLED BY A SET INPUT SIGNAL

CROSS-REFERENCED TO RELATED APPLICATION

This application is related to U.S. Ser. No. 498,727, filed May 27, 1983, and having the same Assignee as the subject application.

BACKGROUND OF THE INVENTION (1) Field of the Invention

The present invention relates to an emitter coupled logic (ECL) circuit which, more particularly to an ECL circuit receives two complementary input logic signals and is controlled by a set input signal.

(2) Description of the Prior Art

An ECL circuit is comprised of a differential amplifier. Therefore, it is possible to achieve very high speed operation. A recent trend has been for the application of an ECL circuit to a logic gate. In one proposal for such an application, the ECL circuit is provided with a set circuit. If the ECL circuit operates as a gate for passing of a certain logic input signal therethrough, the set circuit functions to selectively control the passing therethrough of the logic input signal. For example, if the set input signal (C) has logic "L" (low), the set circuit will allow the logic input signal (A) to pass through the ECL circuit, while if the set input signal (C) has logic "H" (high), the set circuit will not allow the logic input signal (A) to pass through the ECL circuit.

In usual ECL circuits, one side of the differential amplifier comprising the ECL circuit receives the logic input signal, while the other side receives a reference voltage signal ($V_{ref}$). In recent years, however, it has been proposed to apply to the other side, instead of the reference voltage signal ($V_{ref}$), a complementary input signal $\overline{A}$ with respect to the logic input signal A. Use of the complementary logic input signals (A, $\overline{A}$) enlarges the difference between the two control input signals to (A-$\overline{A}$) and, accordingly, offers the advantages of increased noise margin and further high speed operation. When the signals A and $\overline{A}$ are used as the control input signals for the differential amplifier, the amplifier can be driven by a control input signal having a magnitude of, for example, 400 mV.

There are problems, however, with the prior art ECL circuit during the set operation. Specifically, the ECL circuit often fails to be set when it is supposed to be set or is unintentionally set when it is supposed to be set. The reason for this will be explained hereinafter. In any case, this results in reduced reliability of operation of the ECL circuit and necessitates externally and forcibly fixing the set input signal to a suitable level.

SUMMARY OF THE INVENTION

It is an object of the present invention to overcome the problems mentioned above without having to externally and forcibly fix the level of the set signal.

The above object is attained by setting the logic level of the high voltage side of the set input signal higher than the logic level of the high voltage side of the logic input signal by a predetermined level difference and by setting the logic level of the low voltage side of the set input signal lower than the logic level of the low voltage side of the logic input signal by a predetermined level difference. Thus, the difference in magnitude between the high and low logic levels of the logic input signal is set smaller than the difference in magnitude between the high and low logic levels of the set input signal.

BRIEF DESCRIPTION OF THE DRAWINGS

The present invention will be more apparent from the ensuing description with reference to the accompanying drawings, wherein.

DESCRIPTION OF THE PREFERRED EMBODIMENT

Figure 1:
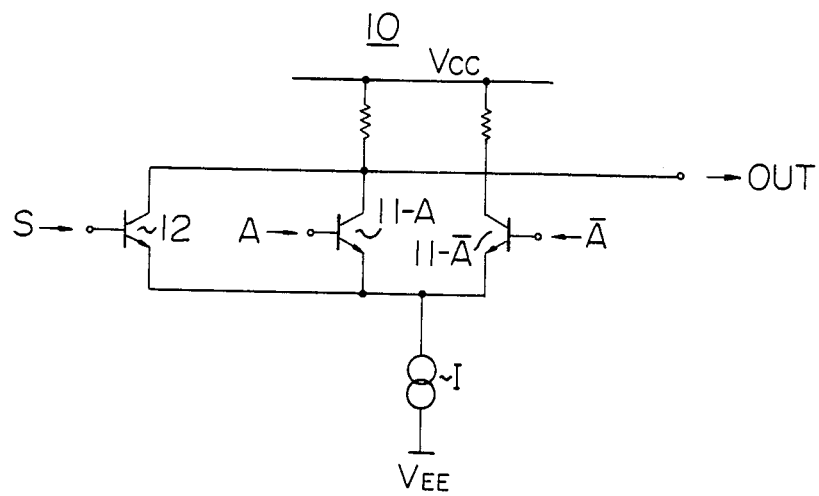
FIG. 1 is a circuit diagram of an ECL circuit to which the present invention is adapted.

FIG. 1 is a circuit diagram of an ECL circuit to which the present invention is to be adapted. In this figure, reference characters 11-A and 11-$\overline{A}$ indicate an emitter coupled pair of differential transistors (differential amplifier). Each collector thereof is connected, via a resistor, to a power source $V_{CC}$. Each emitter thereof is connected via a common constant current source I, to ground $V_{EE}$. The complementary logic input signals A and $\overline{A}$ are applied, as control input signals, to the differential transistor pair 11-A and 11-$\overline{A}$. It should be noted that, in a typical ECL circuit, a reference voltage signal ($V_{ref}$) is currently employed for signal $\overline{A}$. In any case, the ECL circuit produces an output OUT of logic "L" or "H" in accordance with the logic "H" or "L" of signal A.

A recent trend is to use the ECL circuit with a set circuit. In FIG. 1, a transistor 12 represents the set circuit, and transistor 12 is also emitter coupled with the differential transistor pair 11-A and 11-$\overline{A}$. The set transistor 12 receives, as a control input signal, a set input signal S. When the set input signal S is set at the logic "H", the collector of the set transistor 12 is forcibly clamped at the logic "L", and, thereby, the output OUT is maintained at the logic "L". In this case, logic changes by the logic input signal A do not influence logic changes of the output OUT. Consequently, the ECL circuit 10 then operates as a closed gate. On the other hand, when the set input signal S is set at the logic "L", the set transistor 12 is maintained in a cutoff state, the logic change of the logic input signal A appears as it is in the output OUT, and, consequently, the ECL circuit 10 operates as an opened gate.

Figure 2:
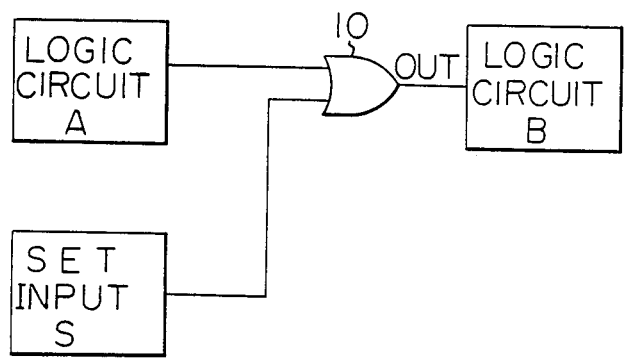
FIG. 2 is a schematic block diagram of a circuit in which the ECL circuit of FIG. 1 is introduced.

FIG. 2 is a schematic block diagram of a circuit in which the ECL circuit of FIG. 1 is introduced. In this figure, the ECL circuit 10 of FIG. 1 is illustrated in the form of an OR gate, a logic circuit (A) and a logic circuit B are connected to each other via the OR gate. Whether the logic input signal from the logic circuit (A) is to be transferred to the logic circuit B is determined by the set input signal from the set input circuit (S). When the set input signal S is logic "H", the logic input signal from the logic circuit (A) is not transferred to the logic circuit B, while, when the set input signal is logic "H", the logic input signal is transferred to the logic circuit B.

When the set input signal S is used to set the ECL circuit 10 (ECL circuit 10 operates as closed gate) or to reset it (ECL circuit 10 operates as opened gate), there is often a problem in that the ECL circuit 10 may fail to be set when it is supposed to be set or may be inadvertently set when it is not.

This results from the variance of the level between the set input signal S and the logic input signal (A, $\overline{A}$) caused by a deviation of resistance values from the design values, temperature changes, external noise, etc.

If the reference voltage signal ($V_{ref}$) is used as the logic input signal $\overline{A}$ for the transistor 11-A' of FIG. 1, there is no problem since the reference voltage ($V_{ref}$) level itself is constant. Thus, the range of relative variance between the reference voltage signal level and the other signal levels is relatively small. If the reference voltage signal ($V_{ref}$) is used, however the advantages of an increased noise margin and high speed operation cannot be expected.

Figure 3:
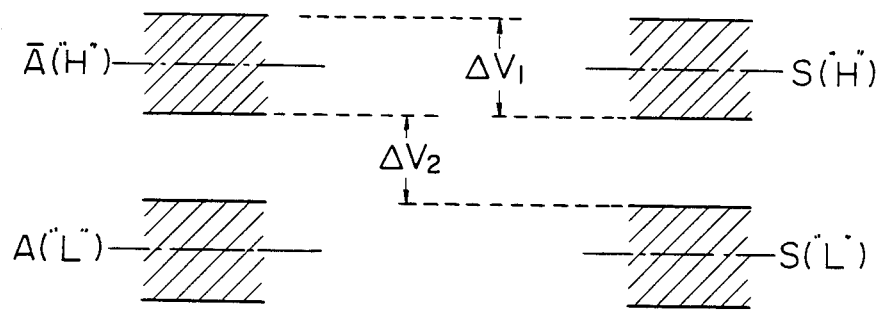
FIG. 3 is a level diagram for explaining the problem in the prior art

However, if the reference voltage signal ($V_{ref}$) is not used so as to increase the noise margin and operation speed, the problem of failure of setting and inadvertent setting becomes serious. FIG. 3 is a level diagram for explaining the problem in more detail. In this figure, the chain-dotted lines represent design values (desired values) of logic "H" and "L" levels for each of the logic input signals A and $\overline{A}$ and the set input signal S. The hatched areas associated with the chain-dotted lines denote ranges of variance in the levels. The the ECL circuit 10 (S="H"), does not set when the logic "H" level of the logic input signal $\overline{A}$ varies the upper range and the logic "H" level of the set input signal S varies into the lower range, and, thus, the level difference $\Delta V_1$ therebetween exceeds a predetermined value of, for example, about 50 mV.

Inadvertent setting of the ECL circuit 10 (S="L") occurs when the logic "H" level of the logic input signal $\overline{A}$ varies into the lower range, the logic "L" level of the set input signal S varies into the upper range, and, thus, the level difference $\Delta V_2$ therebetween exceeds a predetermined value. In the prior art, the problem was overcome by externally supplying a set signal S to ensure that logic "H" had a fully high level and logic "L" had a fully low level. Use of such an externally supplied set signal, however, is clearly inconvenient. Accordingly, strong demand has existed to deal with the problem inside the ECL circuit without employing an externally supplied a signal.

According to the present invention, a certain relationship in the level between the logic input signals and the set input signal is created so as to prevent this problem even with a variation in levels.

Figure 4:
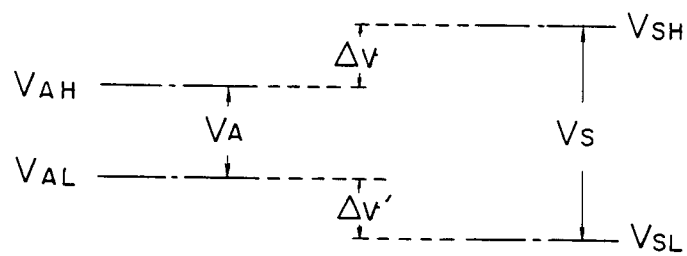
FIG. 4 is a level diagram for explaining the setting of the logic levels in the ECL circuit according to the present invention.

FIG. 4 is a level diagram used for explaining the logic levels in the ECL circuit according to the present invention. A magnitude $V_A$ between a level corresponding to the logic "H" of the logic input signal $\overline{A}$ (same applies to signal A) and a level corresponding to the logic "L" thereof is preset to be smaller than an identical magnitude $V_S$ for the set input signal S. More specifically, a design value (desired value) $V_{AH}$ of the level corresponding to the logic "H" of the logic input signal is set lower by $\Delta v$ than a design value (desired value) $V_{SH}$ of the level corresponding to the logic "H" of the set input signal, while a design value (desired value) $V_{AL}$ of the level corresponding to the logic "L" of the logic input signal is set higher by $\Delta v'$ than a design value (desired value) $V_{SL}$ of the level corresponding to the logic "L" of the set input signal. Generally speaking, the object of the present invention is attained by setting the logic level of the high voltage side of the set input signal higher than the logic level of the high voltage side of the logic input signal by a predetermined level difference and by setting the logic level of the low voltage side of the set input signal lower than the logic level of the low voltage side of the logic input signal by a predetermined level difference. Therefore, the difference in magnitude between the high and low logic levels of the logic input signal is set smaller than the difference in magnitude between the high and low logic levels of the set input signal.

For example, if the magnitude $V_S$ is set to be 450 mV, the values $\Delta v$ and $\Delta v'$ are set as $\Delta v = \Delta v' = 25$ mV. Therefore, the magnitude $V_A$ is set to 400 mV. In short, the range of the level in which the logic input signal level can exist is preset to be smaller than the range of the level in which the set input signal level can exist. This makes it possible to avoid use of an externally supplied level for determining the level of the set input signal S.

This method of setting the levels of the signals can be realized without any particular complicated structure in the ECL circuit.

Figure 5:
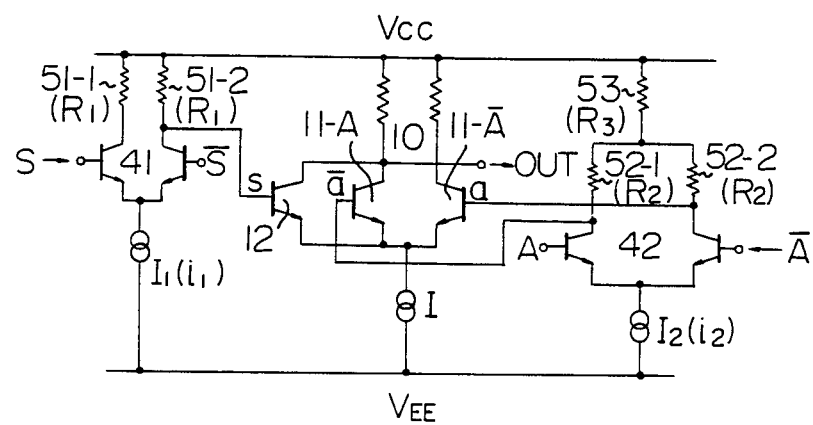
FIG. 5 is a detailed circuit diagram of an ECL circuit according to the present invention.

FIG. 5 is a detailed circuit diagram of an ECL circuit according to the present invention. In FIG. 5, members referenced by numerals and symbols 10, 11-A, 11-$\overline{A}$, 12, I, and OUT have been explained previously. The difference here is that the logic input signals A and $\overline{A}$ are level converted into logic input signals a and $\overline{a}$. Also, the set input signal S is level converted into a set input signal s. These level conversions are performed by a first ECL circuit element 41 and a second ECL circuit element 42 for the set input signal S and the logic input signals A and $\overline{A}$, respectively.

The first ECL circuit element 41 includes a pair of first resistors 51-1 and 51-2, each having a resistance value of $R_1$. The second ECL element circut 42 includes a pair of second resistors 52-1 and 52-2, each having a resistance value of $R_2$, and a third resistor 53 having a resistance value of $R_3$. The first ECL circut element 41 is directly connected to the voltage source $V_{CC}$, while the second ECL circuit element 42 is connected via the third resistor 53.

With reference to FIG. 5, first a current value $i_2$ in a constant current source $I_2$, connected to the second ECL circuit element 42, is suitably determined. Based on the value of $i_2$, the resistance value $R_3$ of the third resistor 53 is determined. This determination is effected, with reference to FIG. 4, along with equation (1).

$$V_{AH} - V_{SH} = i_2 \times R_3 = \Delta v \tag{1}$$

Therefore, $$R_3 = \frac{\Delta v}{i_2}$$

stands. The value of $\Delta v$ is, according to the previously mentioned example, 25 mV.

Next, the resistance values $R_2$ and $R_3$ of the second and third resistors are determined, with reference to FIG. 4, along with equation (2).

$$V_{AL} - V_{SL} = (R_1 \times i_1 - R_2 \times i_2) - i_2 \times R_3 = \Delta v' \tag{2}$$

The value of Δv' is, according to the previously mentioned example, 25 mV.

In equation (2), the term $(R_1 \times i_1 - R_2 \times i_2)$ corresponds to $(V_S - V_A)$ in FIG. 4 (according to the previously mentioned example, which is the same as 450 mV − 400 mV = 50 mV). Then $\Delta v$ $(= i_2 \times R_3)$ is subtracted to give Δv'. Since the values $i_2$ and $R_3$ are already determined, the resistance values $R_1$ and $R_2$, satisfying equation (2) can be selected by suitably determining a current value $i_1$ in a constant current source $I_1$.

Figure 6:
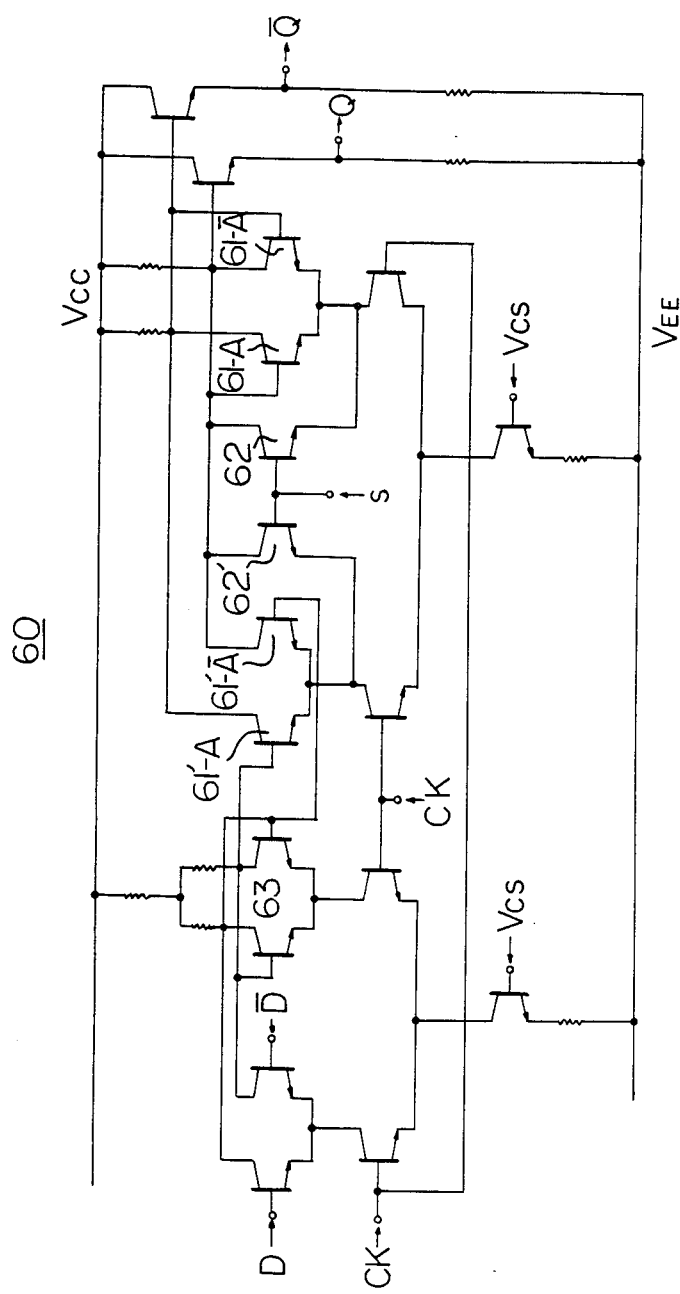
FIG. 6 is a circuit diagram of an application of the ECL circuit in FIG. 5 to a specific circuit.

FIG. 6 is a circuit diagram of an application of the ECL circuit in FIG. 5 to a circuit. The flip flop circuit receives a data signal D and is synchronized by a clock signal CK. The circuit 60 produces a complementary output pair of Q and $\overline{Q}$. Signals $V_{CS}$ indicate chip selection signals. In this figure, reference characters 61-A, 61-Ā and 61'-A, 61'-Ā represent differential transistor pairs, each pair corresponding to the differential transistor pair 11-A, 11-Ā in FIG. 5. Reference numerals 62 and 62' represent set transistors, each corresponding to the set transistors 12 in FIG. 5, and controlled by set input signal S. The transistor pair 42 of FIG. 5 corresponds to a transistor pair 63 in FIG. 6. There is no transistor pair corresponding to the transistor pair 41 of FIG. 5 illustrated in FIG. 6, however, the resultant output thereof is indicated by the same character s.

As explained above in detail, the problem of failure of setting and inadvertently setting the ECL circuit can be overcome by providing a set circut, according to the present invention, without having to externally and forcibly fix the level of the set input signal.

We claim:

1. An emitter coupled logic circut, operatively connected to receive complementary logic input signals having high and low potentials, respectively, and a set input signal having a high potential side and a low potential side and being operatively connectable to first and second power supplies, said emitter coupled logic circuit having an output terminal and comprising:
    a differential transistor pair, operatively connected between the first and second power supplies, one transistor of said differential transistor pair having a collector operatively connected to the output terminal for providing an output from the differential transistor pair, the transistors in said differential transistor pair having bases operatively connected to receive the complementary logic input signals as control input signals, respectively, said differential transistor pair having emitters coupled to each other; and
    a set transistor having a base operatively connected to receive the set input signal as a control input signal, said set transistor being connected in parallel with said differential transistor pair,
    a logic level of the high potential side of the set signal being higher than a logic level of the high potential of the complementary logic input signals by a first predetermined level difference, and
    a logic level of the low potential side of the set input signal being lower than a logic level of the low potential of the complementary logic input signals by a second predetermined level difference.

2. An emitter coupled logic circuit as set forth in claim 1, wherein said first and second level differences are generated by level conversion of the complementary logic input signals and the set input signal.

3. An emitter coupled logic circut as set forth in claim 2, wherein said level conversion is performed by first and second emitter coupled logic circuits, wherein said first emitter coupled logic circuit is operatively connected to the base of said set transistor, for performing level conversion with respect to the set input signal and outputting a signal to said set transistor, and wherein said second emitter coupled logic circuit is operatively connected to the bases of the transistors in said differential transistor pair, for performing level conversion with respect to the logic input signals and outputting a signal to said differential transistor pair.

4. An emitter coupled logic circuit as set forth in claim 3, further comprising first and second constant current sources having first and second current values, respectively, operatively connected to ground and a voltage source, wherein said first emitter coupled logic circuit is operatively connected to said first constant current source, and comprises a pair of first resistors operatively connected to the voltage source, and wherein said second emitter coupled logic circuit is operatively connected to said second constant current source, and comprises a third resistor operatively connected to the voltage source and a pair of second resistors operatively connected to said third resistor.

5. An emitter coupled logic circuit as set forth in claim 4, wherein the logic level ($V_{AH}$) of the high potential of the complementary logic input signals, the logic level ($V_{AL}$) of the low potential of the complementary logic input signals, the logic level ($V_{SH}$) of the high potential of the set input signal, the logic level ($V_{SL}$) of the low potential of the set input signal, the first predetermined level difference (V), the second predetermined level difference (V'), the first current value $i_1$ of said first constant current source, the second current value $i_2$ of said second current source, and resistance values, $R_1$, $R_2$, and $R_3$, of said first, second and third resistors, respectively, are determined so as to satisfy the following equations:

$$V_{AH} - V_{SH} = i_2 \times R_3 = v;$$

and $$V_{AL} - V_{SL} = (R_1 \times i_1 - R_2 \times i_2) - i_2 \times R_3 = v'.$$

6. An emitter coupled logic circuit as set forth in claim 5, wherein the values of Δv, Δv', ($V_{SH} - V_{SL}$), and ($V_{AH} - V_{AL}$) are 25 mV, 25 mV, 450 mV, and 400 mV, respectively.

7. A logic circuit operatively connected to receive set signals and first and second logic input signals and operatively connectable to first and second power supplies, and having an output terminal, said logic circuit comprising:
    a first emitter coupled logic circuit, operatively connected to receive the set signals and operatively connected between the first and second power supplies, for level converting the set signals to a first predetermined level;
    a second emitter coupled logic circuit, operatively connected to receive the first and second logic input signals and operatively connected between the first and second power supplies, for level converting the first and second logic input signals to first and second converted logic input signals which are within a second predetermined level;

a set circuit, operatively connected to said first emitter coupled logic circuit, for receiving the converted set signals as control signals; and a differential transistor pair, operatively connected between said set circuit and said second emitter coupled logic circuit, one transistor of said differential transistor pair having a collector operatively connected to the output terminal for providing an output from said differential transistor pair and the other transistor of said differential transistor pair having a collector operatively connected to the first power supply, the transistors in said differential transistor pair having emitters operatively connected to each other and to the second power supply, one transistor of said differential transistor pair having a base operatively connected to receive the first converted logic input signal and the other transistor of said differential transistor pair having a base operatively connected to receive the second converted logic input signal.

8. A logic circuit as set forth in claim 7, wherein said first emitter coupled logic circuit includes a pair of first resistors operatively connected thereto and operatively connected to the first power supply and wherein said second emitter coupled logic circuit includes a pair of second resistors operatively connected thereto and operatively connected to each other at a connection node, and a third resistor operatively connected between the connection node of said second pair of resistors and the first power supply.

9. A logic circuit as set forth in claim 7, wherein said first predetermined level of the set signals has a high voltage side and a low voltage side and said second predetermined level of the first and second logic input signals has a high voltage side and a low voltage side and wherein the high voltage side of the set signals is higher than the high voltage side of the first and second logic input signals and wherein the logic level of the low voltage side of the set signals is lower than the logic level of the low voltage side of the first and second logic input signals.

10. A logic circuit as set forth in claim 7, further comprising:

a first constant current source operatively connected between said emitters of said differential transistor pair and ground;

a second constant current source operatively connected between said first emitter coupled logic circuit and ground; and a third constant current source operatively connected between said second emitter coupled logic circut and ground.

11. A logic circuit, operatively connected to receive complementary logic input signals and a set signal, and having an output terminal, comprising:

level converter means, respectively, operatively connected to receive the set signal and the complementary logic input signals, for providing a level converted set signal and level converted complementary logic input signals;

set means, operatively connected to said level converting means and operatively connected to receive the level converted set signal, for setting the logic circuit; and differential means, operatively connected to said level converting means and to the output terminal for providing an output from said differential means, and operatively connected to receive the level converted complementary logic input signals, for providing a difference between the level converted complementary logic input signals.

12. A logic circuit as set forth in claim 11, wherein said set signal has a high and low potential and said complementary logic input signals have high and low potentials, a logic level of the high potential of the set signal being higher than a logic level of the high potential of the complementary logic input signals by a first predetermined level difference, a logic level of the low potential of the set input signal being lower than a logic level of the low potential of the complementary logic input signals by a second predetermined level difference, and wherein the first and second level differences are generated by the level converted complementary logic input signals and the level converted set signal.

13. A logic circuit as set forth in claim 12, wherein said set means comprises a set transistor having a base operatively connected to receive the level converted set signal and operatively connected to a power supply, said differential means comprises a differential transistor pair operatively connected to said level converting means and wherein said level converting means comprises a first emitter coupled logic circuit, operatively connected to said base of said set transistor, for level converting the set signal, and a second emitter coupled logic circuit, operatively connected to said differential transistor pair, for level converting the complementary logic input signals.

* * * * *

UNITED STATES PATENT AND TRADEMARK OFFICE
CERTIFICATE OF CORRECTION

PATENT NO. : 4,551,639

DATED : NOVEMBER 5, 1985

INVENTOR(S) : HIROFUMI TAKEDA ET AL.

It is certified that error appears in the above-identified patent and that said Letters Patent is hereby corrected as shown below:

```
Col. 1, line 14, delete "which";
        line 15, after "circuit" insert --which--;
        line 24, delete "of";
        line 51, "is supposed" should be --is not supposed--.

Col. 2, line 15, "art" should be --art;--;
        line 33, "connected" should be --connected,--.

Col. 4, line 33, "a" (both occurrences) should be --a--;
        line 35, "s" should be --s--.

Col. 5, line 7,  "Then" should be --Then,--;
        line 10, "(2)" should be --(2),--;
        line 27, "s" should be --s--;
        line 34, "circut" should be --circuit--.

Col. 6, line 1, "circut" should be --circuit--.
```

Signed and Sealed this

Twenty-fifth Day of February 1986

[SEAL]

Attest:

DONALD J. QUIGG

Attesting Officer

Commissioner of Patents and Trademarks